United States Patent [19]

Huang et al.

[11] Patent Number: 5,130,266
[45] Date of Patent: Jul. 14, 1992

[54] POLYCIDE GATE MOSFET PROCESS FOR INTEGRATED CIRCUITS

[75] Inventors: Cheng H. Huang, Hsin-Chu; Water Lur, Taipei, both of Taiwan

[73] Assignee: United Microelectronics Corporation, Hsinchu, Taiwan

[21] Appl. No.: 573,814

[22] Filed: Aug. 28, 1990

[51] Int. Cl.$^5$ .................................. H01L 21/265
[52] U.S. Cl. ................................ 437/44; 437/41; 437/192; 437/193; 437/200; 148/DIG. 147
[58] Field of Search ............... 437/43, 44, 192, 200, 437/193, 41; 148/DIG. 147

[56] References Cited

U.S. PATENT DOCUMENTS

| | | | |
|---|---|---|---|
| 4,597,163 | 7/1986 | Tsang | 437/41 |
| 4,690,730 | 9/1987 | Tang et al. | 437/200 |
| 4,740,484 | 4/1988 | Norstrom et al. | 437/200 |
| 4,774,201 | 9/1988 | Woo et al. | 437/200 |
| 4,900,257 | 2/1990 | Maeda | 437/192 |
| 4,923,822 | 5/1990 | Wand et al. | 437/41 |
| 4,933,994 | 6/1990 | Orban | 437/44 |
| 4,935,380 | 6/1990 | Okumura | 437/44 |
| 4,983,544 | 1/1991 | Lu et al. | 437/200 |
| 4,985,372 | 1/1991 | Narita | 437/200 |
| 5,059,554 | 10/1991 | Spinner et al. | 437/200 |

FOREIGN PATENT DOCUMENTS

| | | | |
|---|---|---|---|
| 0339586 | 11/1989 | European Pat. Off. | 437/193 |
| 0174745 | 8/1986 | Japan | 148/DIG. 147 |
| 0169743 | 7/1988 | Japan . | |

OTHER PUBLICATIONS

Bernard et al., "Chemical Vapor Deposition of Refractory Metal Silicides for VLSI Metallization", Solid State Tech., Feb. 1989, pp. 79–84.
Shioya, "Properties of Chemical Vapor Deposited Tungsten Silicide Films Using Reaction of WF$_6$ and Si$_2$H$_6$", J. Electrochem. Soc.: Solid State Science and Technology, May 1987, pp. 1220–1224.

Primary Examiner—Brian E. Hearn
Assistant Examiner—Tuan Nguyen
Attorney, Agent, or Firm—George O. Saile

[57] ABSTRACT

A method is described for fabricating a lightly doped drain MOSFET integrated circuit device which overcomes the peeling problems of refractory metal silicide layers on a polycide gate. The process of this invention has been simplified by not using several of the high thermal cycle process steps believed to be necessary for successfully making a polycide gate lightly doped drain MOS FET integrated circuit. These steps are (1) the thermal oxidation after the polycide etching step, (2) the densification step after the blanket deposition of silicon dioxide layer for the spacer preparation, and (3) the silicon oxide capping of the refractory metal silicide layer after the spacer formation by anisotropically etching. The result is a process that provides a non-peeling polycide gate lightly doped drain MOS FET integrated circuit device.

15 Claims, 5 Drawing Sheets

POLYCIDE GATE MOSFET PROCESS FOR INTEGRATED CIRCUITS

BACKGROUND OF THE INVENTION (1) Field of the Invention

The present invention relates to methods for producing integrated circuit devices having lightly doped drain MOSFET with refractory metal polycide gate structures.

(2) Description of Prior Art

The use of polycide gates or interconnect lines, that is a combination of layers of polysilicon and a refractory metal silicide is becoming very important as the industry moves to smaller device geometries. In the past, polysilicon was satisfactory as the gate electrodes and for interconnecting lines. However, as these geometries become smaller, polysilicon has become too high in resistivity for these applications due to its affect on RC time delays and IR voltage drops. The use of a combination of refractory metal silicides with polysilicon has proven suitable because of its lower resistivity.

Silicides of certain refractory metals, i.e. tungsten, molybdenum, titanium, and tantalum have been proven to be suitable for use as a low resistance interconnect material for VLSI integrated circuit fabrication. The disilicides pair very well with heavily doped polysilicon to form polycide gates, because of the criteria of low resistivity and high temperature stability. Tungsten silicide has particularly been found to be capable of overcoming some shortcomings, such as stoichiometry control, surface roughness, adhesion, oxidation and reproducibility to be very useful in combination with polysilicon.

The preferred deposition technique of tungsten silicide is low pressure chemical vapor deposition. The oxidation characteristics of tungsten silicide as produced by this method are very similar to those of polysilicon. The silicon to tungsten ratio in the tungsten silicide film can vary according to the tungsten fluoride and silane gas mixture and reactor conditions. It has been found that low pressure chemical vapor deposited tungsten silicide is stable as soon as the silicon to tungsten ratio is moderately greater than two. Higher silicon concentration is necessary to provide excess silicon during high temperature oxidation, maintain tungsten silicide stoichiometry, and improve silicide adhesion to polysilicon.

It is also a fact that peeling of this polycide film can happen frequently if care is not taken during processing and handling of the wafers. This in turn causes the low yield of the product. This peeling and/or less integrity of the silicide problems are always observed after thermal treatments.

The conventional polycide process forms sequentially the gate oxide layer by thermal oxidation, the polysilicon layer which is then doped, and the refractory metal silicide in situ. These layers are now etched in the desired pattern of polycide gate structures. A silicon dioxide is then thermally grown upon the surfaces of the polycide and exposed silicon substrate. The dielectric spacer is formed by blanket chemical vapor deposition of silicon dioxide, a heat densification step and an anisotropic etching of the silicon dioxide layer. The results of this process is peeling of the refractory metal silicide.

The workers in the field have tried to overcome this problem by capping with silicon dioxide during the reaction of titanium with the underlying polysilicon layer such as shown by T. E. Tang et al in U.S. Pat. No. 4,690,730. The peeling was suppressed, but the formation of a noncrystalline layer was found to be inevitable. In addition, the capping layer is detrimental to the source/drain implantation and process control.

Others have tried to overcome this peeling problem by special cleaning steps. For example, wet etchants have been used to clean the polysilicon layer's surface before deposition of the refractory metal silicide. This has resulted in a poor surface and interface between the layers of polysilicon and silicide.

It is therefore an important object of this invention to provide a method for fabricating integrated circuits which overcomes this peeling problem and raises yields.

SUMMARY OF THE INVENTION

The oxidation characteristics of the preferred refractory metal silicide is very similar to those of polysilicon. The silicon/tungsten ratio in the tungsten silicide films can vary according to the tungsten fluoride and silane gas mixture and reactor temperature. It has been found that low pressure chemical vapor deposition is stable as soon as the silicon/tungsten ratio is moderately greater than two. Higher silicon concentration is necessary to provide excess silicon during high temperature oxidation, maintain tungsten silicide stoichiometry, and improve silicide adhesion to the polysilicon layer.

The as-deposited tungsten disilicide has an amorphous structure and crystallizes into hexagonal tungsten disilicide by annealing around 450° C. After annealing at temperatures higher than 650° C., the hexagonal phase was found to transform into the tetragonal phase. Excess silicon in the tungsten disilicide was found to precipitate at the disilicide/polysilicon interface.

The process of this invention has been simplified by not using several of the high thermal cycle process steps believed to be necessary for successfully making a polycide gate lightly doped drain MOS FET integrated circuit. These steps are (1) the thermal oxidation after the polycide etching step, (2) the densification step after the blanket deposition of silicon dioxide layer for the spacer preparation, and (3) the silicon oxide capping of the refractory metal silicide layer after the spacer formation by anisotropically etching. The result is a process that provides a non-peeling polycide gate lightly doped drain MOS FET integrated circuit device.

In accordance with the present invention, a method is described for fabricating a lightly doped drain MOSFET integrated circuit device which overcomes the problems described above in prior integrated circuit devices. The method begins by forming a pattern of gate electrode structures upon a semiconductor substrate which structures each includes a gate oxide, a polysilicon layer and an amorphous refractory metal silicide. A pattern of lightly doped regions in the substrate is formed by ion implantation using the polycide gate structures as the mask. A dielectric spacer structure is formed upon the sidewalls of each of the polycide gate structures and over the closely adjacent portions of the substrate. A thin thermal silicon oxide is formed over the exposed surfaces of the substrate, spacer and polycide layer and simultaneously the refractory metal is transformed from its amorphous form to its crystalline form. A pattern of heavily doped regions in the substrate is formed by ion implantation using the polycide structures witt spacer structures as the mask to produce the lightly doped drain source/drain structures of an MOSFET device. The integrated circuit device is completed by forming a passivation layer over the structures described and appropriate electrical connecting structures thereover to electrically connect the gate electrode structures and source/drain elements.

A variation on the above method is to simply do two implants, one of phosphorous, N− and the other of arsenic N+ as is known in the art. The phosphorous ions move faster than the arsenic ions and form the desired double diffused drain structure.

Also in accordance with the present invention, there is the resulting integrated circuit device structure from the method described above. This lightly doped drain or double diffused drain MOS FET integrated circuit device includes a pattern of gate electrode structures upon a semiconductor substrate which structures each includes a gate oxide, a polysilicon layer and a crystalline refractory metal silicide layer. A pattern of lightly doped regions is located in the substrate adjacent to the structures. An undensified dielectric spacer structure is located upon the sidewalls of each of the polycide structures and over the adjacent portions of the substrate. A thin silicon dioxide layer is located over the exposed substrate, spacer and polycide layer. A pattern of heavily doped regions is located in the substrate adjacent to the spacer structure on the sidewalls of the polycide structures and this heavily doped pattern overlaps in part the lightly doped pattern. This pattern forms the lightly doped drain source/drain structures of an MOS FET device. Appropriate electrical connecting structures thereover to electrically connect the gate electrode structure and source/drain elements.

DESCRIPTION OF THE PREFERRED EMBODIMENTS

Referring now more particularly to FIGS. 1 through 4, there is shown a method for making the lightly doped drain device of the present invention. The first series of steps involve the formation of the dielectric isolation regions for isolating semiconductor surface regions from other such regions in the semiconductor substrate 11. The semiconductor substrate is preferably composed of silicon having a (100) crystallographic orientation. In an effort to simplify the description and the drawings the dielectric isolation between devices have not been shown and will not be described, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide. Then semiconductor devices can be provided in the silicon mesas according to the following processes.

The surface of the silicon substrate 11 is thermally oxidized to form the desired gate oxide 12 thickness. The preferred thickness is between about 0.01 to 0.04 micrometers. The polysilicon layer 14 is blanket deposited by low pressure chemical vapor deposition (LPCVD). The preferred thickness of the polysilicon layer 14 is between about 0.1 to 0.4 micrometers. The polysilicon layer 14 is ion implanted with phosphorous ions under the conditions with dose over $1 \times 10^{15}$ atoms/cm.$^2$ or doped with $POCl_3$ to a concentration of about $1 \times 10^{20}$ atoms/cm.$^3$. The resulting surface is cleaned by dipping in a diluted HF solution.

Figure 1:
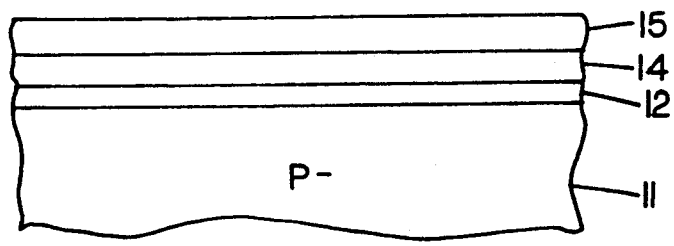
FIG. 1 through FIG. 4 schematically illustrate the method for making a lightly doped drain MOS FET polycide gate integrated circuit of the invention.

An amorphous refractory metal silicide layer 15 is deposited using low pressure chemical vapor deposition over the polysilicon layer 14 to produce the FIG. 1. structure. The amorphous layer 15 has a chemical formula of $MSi_x$ where M is the refractory metal and x is between 2.2 to 2.8. It is desirable to have x in this range because thereafter the silicide layer would be stable after thermal treatments. The preferred condition is $x=2.6$.

The preferred metal silicide is tungsten silicide and the preferred deposition conditions are $WF_6 = 8$ to 14 sccm and $SiH_4 = 200$ to 800 sccm at a temperature higher than 300° C. and pressure of between about 100 to 500 mTorr. The thickness of the metal silicide in between about 0.05 to 0.4 micrometers the preferred thickness is 0.25 micrometers.

Lithography and etching is now used to form a lithographic mask over the polycide layered structure. The mask pattern protects the designated are to be the polycide gate structures. The masked structure is now exposed to a plasma etching ambient of, for example $CClf_3/SF_6/He$ gases to remove the unwanted portions of the polysilicon layer 14 and refractory metal silicide layer 15.

The conventional thin silicon oxide film formation by thermal oxidation is conventionally performed at this stage of the process and which will cause the crystallization of the refractory metal silicide. This is not used in our process.

Figure 2:
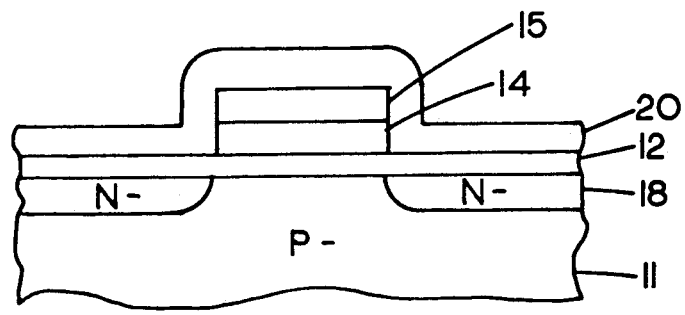
Figure 3:
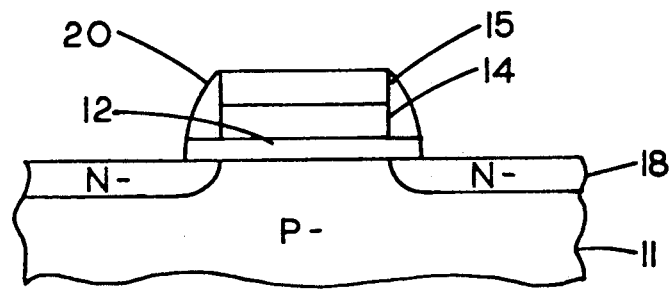
Figure 4:
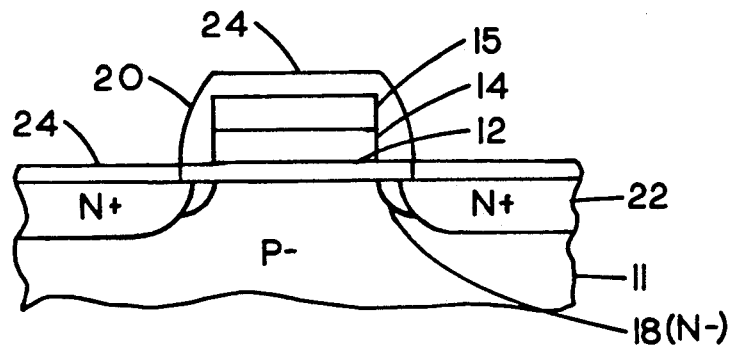

The source/drain structure of the MOS FET may now be formed by the following steps. The FIGS. 2 through 4 illustrate the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate.

FIG. 2, for example shows the ion implantations of N−dopants. Lithographic masks may be required to protect the areas not to be subjected to that particular N−ion implantation. The formation of the lithographic masks are done by conventional lithography and etching techniques. The N-lightly doped drain implantation 18 is done with for example phosphorous P31 at a dose of between about $1 \times 10^{12}$ to $1 \times 10^{14}$ atoms/cm.$^2$ and with an energy of between about 30 to 70 Kev.

The dielectric spacer 20 is now to be formed followed by the completion of the lightly doped drain source/drain structures and may be better understood with reference to FIGS. 2 through 4. A low temperature silicon dioxide deposition is preferred such as through the chemical vapor deposition of tetraethoxysilane (TEOS) at a temperature in the range of between about 400° to 430° C. However, it is greatly preferred to have the spacer formation at about 410° C. so that the refractory metal will stay in its amorphous form. The thickness of the dielectric silicon dioxide layer 20 is between about 1000 to 400 Angstrom and preferably 2000 Angstroms.

A densification step is conventionally used at this stage in the process which involves a high thermal cycle. This step is not done in our process so that the refractory metal silicide will remain amorphous.

An anisotropic etching of this layer produces the dielectric spacer layer 20 on the sidewalls of the polycide structures 14, 15. This critical spacer etching process must be performed before any thermal cycle to avoid the damage in the refractory metal disilicide layer 15 or else the refractory metal silicide will peel and/or a noncrystalline layer, with oxygen, carbon, and fluorine contained in it, would form on the stacked structure and the silicide/polysilicon interface would be rough and unacceptable. The preferred anisotropic etching uses a conventional reactive ion etching ambient. The exposed silicon dioxide layer 12 is also removed along with the unwanted portions of layer 20 by the reactive ion etching as can be seen by the FIG. 3.

A thin silicon oxide layer 24 is formed upon the refractory metal silicide layer 15, the spacers 20 and the exposed silicon substrate. The oxidation conditions are an ambient of dry or wet oxygen at a temperature of less than 1000° C. for about 15 minutes to produce a silicon dioxide coating of between about 50 to 300 Angstroms and a preferred thickness of 150 Angstroms over the exposed substrate 11 and the refractory metal silicide 15 and a much smaller thickness, if any over the spacers 20.

Referring now to FIG. 4, the N+source/drain ion implantation uses Arsenic, As75 with a dose of between about $1 \times 10^{15}$ to $1 \times 10^{16}$ atoms/cm.$^2$ and energy of between about 40 to 100 Kev. to complete the source/drain regions 22 of the N channel lightly doped drain MOS FET integrated circuits device.

The passivation layer (not shown) is now deposited over the upper surfaces of the FIG. 4 structure. The appropriate connections now have to be made to electrically connect the various gate electrodes and source/drain elements to form the integrated circuit device. The contact (not shown) to the source/drain elements requires a contact etching step that forms openings to the source/drain elements through the passivation layer.

Appropriate metallurgy (not shown) is now deposited and patterned to electrically connect the gates and source/drain elements to form the integrated circuit device. This metallurgy is conventional and may be formed of polysilicon, aluminum, aluminum with dopants of copper and/or silicon, polycide and the like.

Referring now more particularly to FIGS. 8A through 8D there is shown the second embodiment which is directed to the double diffused drain (DDD) process variation on the first embodiment of FIGS. 1 through 4. The two processes are identical through the polycide patterning by etching. The like numbers indicated like structures. After the polycide etch, in this process the silicon oxide deposition and spacer anisotropic etching steps are done to produce the spacer 20. A thin silicon dioxide layer 24 is grown on the exposed silicon surfaces by conventional thermal oxidation techniques. An N+source/drain mask in formed by conventional lithography and etching. The DDD N−implant of phosphorous is made and then the N+source/drain implant of arsenic is made. The phosphorous ions move faster into the silicon than do the arsenic ions at like temperature to form the FIG. 8D structure where region 18 is N− and region 22 is N+. The remaining steps needed to form any P channel MOS FET devices and passivation/metallurgy layers to complete the integrated circuit are the same as the FIG. 1 through 4 embodiment.

The following Examples are given using tungsten disilicide as the refractory metal layer in an effort to point out the important problem solving features of the present invention over the problems of the prior art.

EXAMPLE I

The FIG. 5A through FIG. 5D conventional Prior Art process was followed using the following major process flow for the tungsten silicide polycide gate formation:

(a) gate thermal oxidation of silicon (100) substrate 30 at temperature of 900° C. and in a dry oxygen ambient to form gate oxide 32 of about 250 Angstroms.

(b) polysilicon deposition by chemical vapor deposition (CVD) to form layer 33 of about 2000 Angstroms.

(c) phosphorous ion implantation or POCl$_3$ into the polysilicon to a resistance of about 60 ohms per square.

(d) tungsten silicide deposition by CVD to form a layer 35 of a thickness of about 2500 Angstroms.

(e) polycide anisotropic etching in a chlorine/helium gas ambient.

Figure 5A:
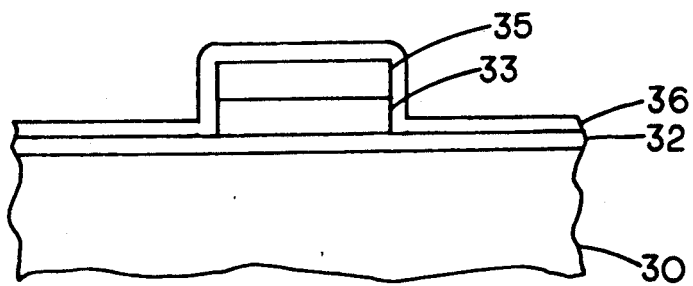
FIG. 5A through FIG. 5D schematically illustrate the conventional Prior Art process for fabricating a lightly doped drain MOS FET polycide gate integrated circuit.

(f) thin silicon oxide oxidation (I) at about 900° C. in an ambient of nitrogen and oxygen to form a layer 36 of a thickness of about 150 Angstroms. FIG. 5A shows this structure.

(g) lightly doped drain (LDD) implantation. Not shown in the drawing for simplicity.

(h) CVD spacer oxide deposition to a thickness of about 2400 Angstroms.

Figure 5B:
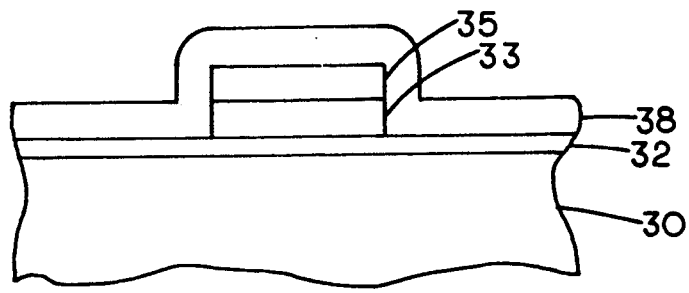

(i) densification of the spacer oxide layer 38 in a nitrogen atmosphere at a temperature of 900° C. FIG. 5B shows this structure.

Figure 5C:
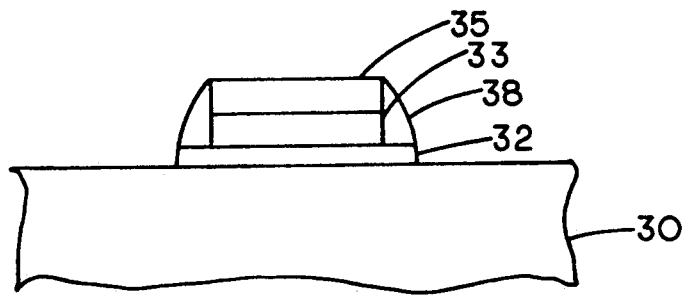
Figure 5D:
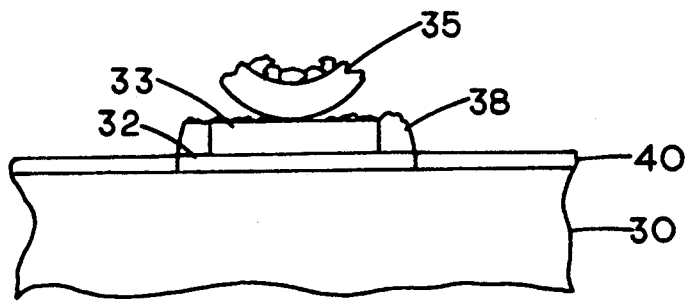

(j) anisotropic oxide spacer etching using carbon hydrogen trifluoride and oxygen gases. FIG. 5C shows this structure.

(k) thin silicon oxide oxidation (II) at 900° C. in an ambient of nitrogen and oxygen forms a layer 40 to a thickness of about 150 Angstroms.

(l) N+source/drain implantation. Not shown in drawing for simplicity.

(m) thin silicon oxide oxidation (III) at 900° C. in an ambient of nitrogen and oxygen to a thickness of about 150 Angstroms.

(n) P+source/drain implantation.

The conventional process of tungsten disilicide polycide formation for a lightly doped drain structure is given and it produces an unsatisfactory peeling in many of the polycide gate electrodes as illustrated in the FIG.

5D schematic illustration. The deposited tungsten disilicide films are of the amorphous phase with the silicon/tungsten atomic ratio of $x=2.6$. The silicide is crystallized to be polycrystalline tetragonal tungsten disilicide with the silicon/tungsten atomic ratio being about $x=2.2$ in the whole layer after the thin silicon oxide oxidation (I) process step. The peeling and less integrity of the silicide layer are always observed after the thin silicon oxide oxidation (II) process step.

EXAMPLE II

The FIG. 6A through 6D conventional process with a cleaning step prior to the deposition of the tungsten disilicide layer 35 was used in this Example. The major process flow was repeated from that given in the EXAMPLE I, above and like numbers in the drawings mean like process steps and resulting structures.

The process was repeated for this group of sample wafers until the polysilicon layer 33 was doped with phosphorous. The polysilicon layer was cleaned using a 10 water: 1 HF etchant and followed by a sulfuric acid/water etch and finally deionized water rinse. After this cleaning step, the tungsten disilicide film is deposited upon the polysilicon layer immediately.

Figure 6A:
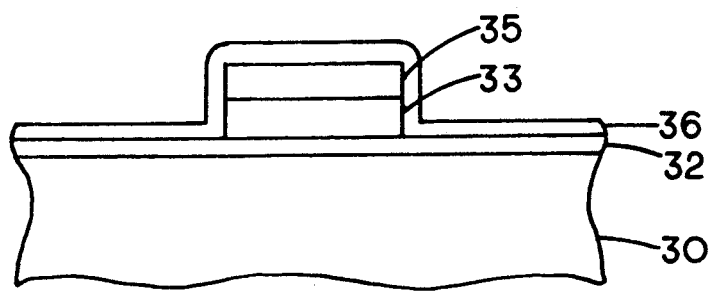
FIG. 6A through FIG. 6D schematically illustrate the conventional Prior Art process plus cleaning step prior to refractory metal silicide deposition for fabricating a lightly doped drain MOS FET polycide gate integrated circuit.
Figure 6B:
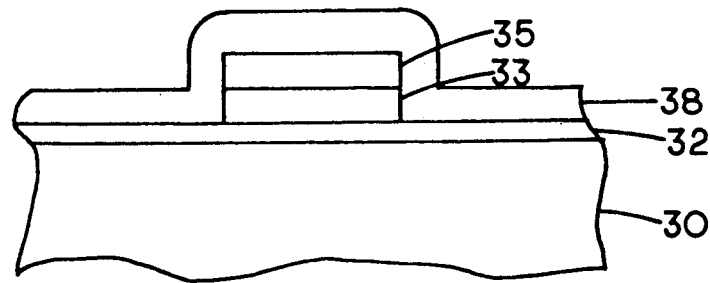
Figure 6C:
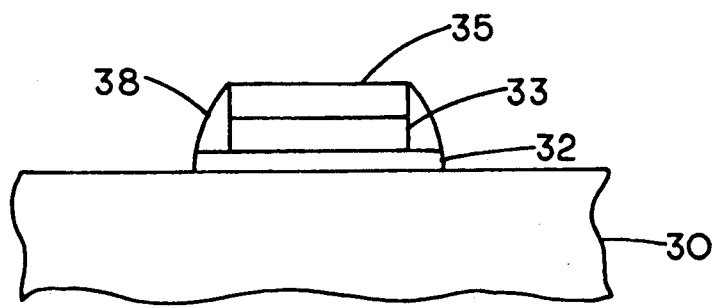
Figure 6D:
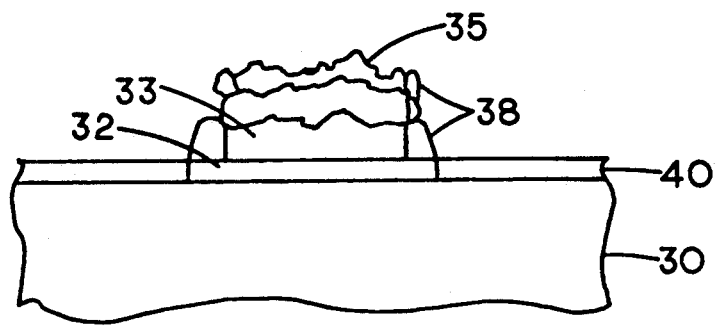

The process continued exactly as was described in the EXAMPLE I. FIG. 6A shows the structure after the thin silicon oxide oxidation (I). FIG. 6B shows the structure after oxide spacer densification. FIG. 6C shows the structure after the spacer oxide etching step. FIG. 6D shows the structure at the completion of the process. This cleaning of the polysilicon prior to tungsten silicide attempts to remove any native oxide or phosphorous glass from its surface. The resulting structure did not peel, but the quality of the polycide was poor as is schematically illustrated in FIG. 6D.

EXAMPLE III

The FIG. 7A through 7E conventional process with a silicon oxide capping step prior to the thin silicon oxide oxidation (II) step was used in this Example. The major process flow was repeated from that given in the EXAMPLE I, avobe and like numbers in the drawings mean like process steps and resulting structures.

Figure 7A:
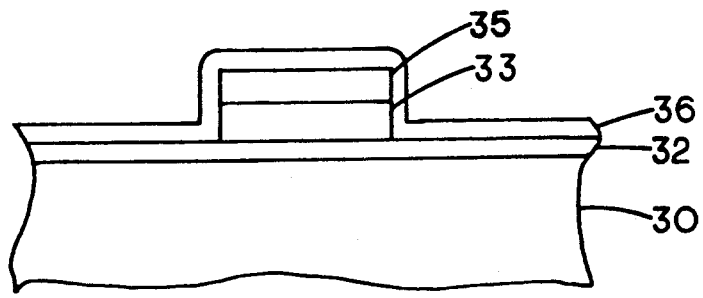
FIG. 7A through FIG. 7E schematically illustrate the conventional Prior Art process plus capping of the polycide for fabricating a lightly doped drain MOS FET polycide gate integrated circuit.
Figure 7B:
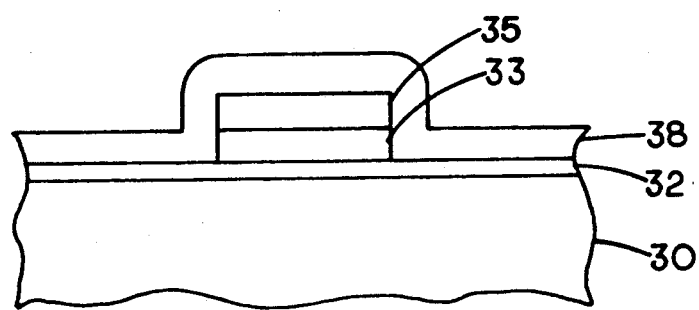
Figure 7C:
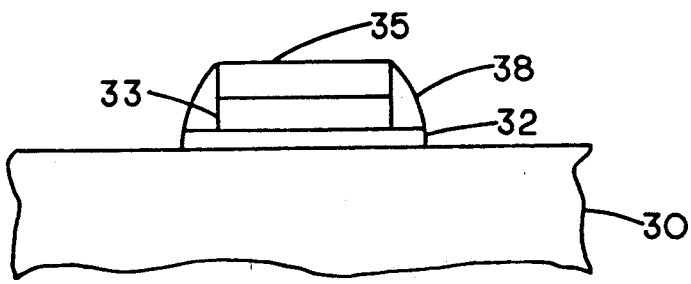
Figure 7D:
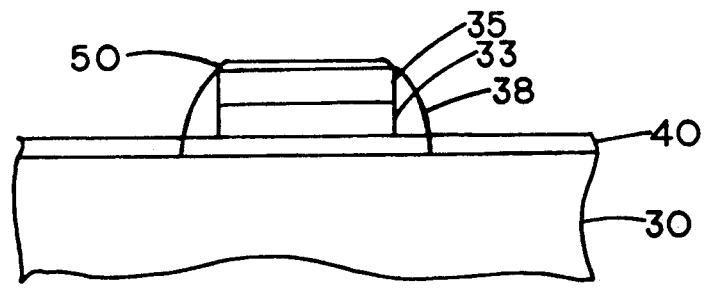
Figure 7E:
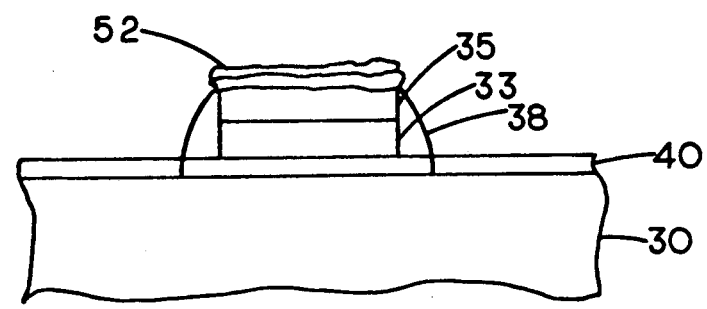
Figure 8A:
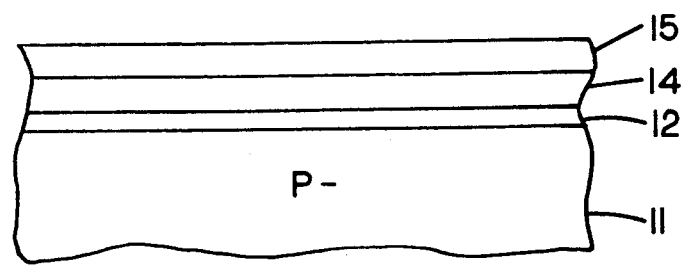
FIG. 8A through FIG. 8D schematically illustrate the double diffused drain (DDD) embodiment alternative to the first embodiment illustrated in conjunction to FIG. 1 through 4.
Figure 8B:
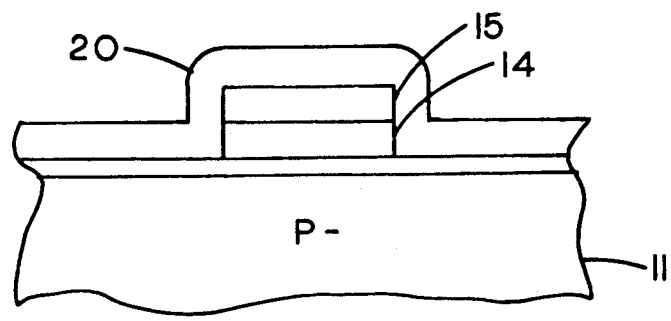
Figure 8C:
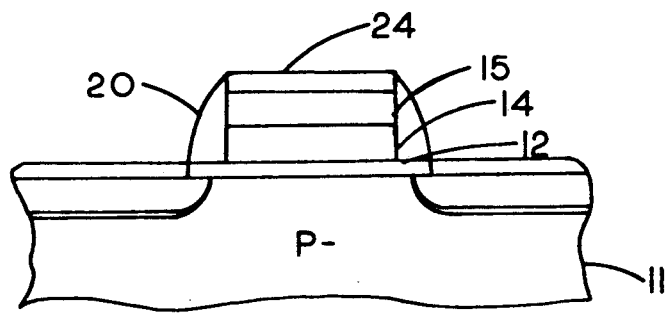
Figure 8D:
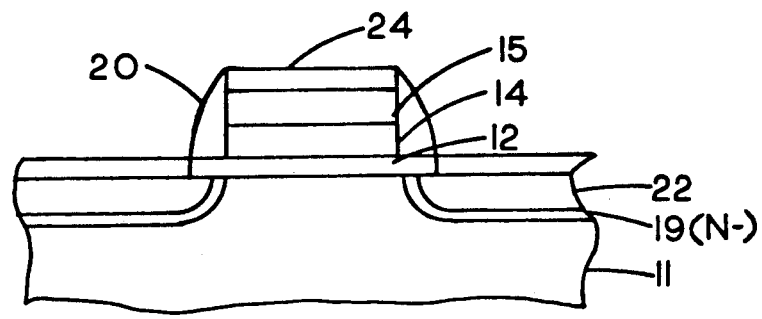

The process was repeated for this group of sample wafers until the after the silicon oxide spacer anisotropic etching was completed. A thin silicon dioxide layer 50 having a thickness of between 300 to 500 Angstroms were formed by atmospheric chemical vapor deposition. The process as given in Example I was then completed. FIG. 7A shows the structure after the thin silicon oxide oxidation (I). FIG. 7B shows the structure after oxide spacer densification. FIG. 7C shows the structure after the spacer oxide etching step. FIG. 7D shows the structure after formation of the capping silicon dioxide layer 50. FIG. 7E shows the structure at the completion of the process.

The resulting polycide electrode 52 as schematically illustrated in FIG. 7E is damaged and unsatisfactory. There is inevitably an unwanted noncrystalline layer 54 under the capping thin silicon dioxide layer. The capping oxide does hold the underlaying damaged and unstable silicide layer from peeling. The layer is unstable because the atomic ratio of silicon to tungsten is 2.0 or less.

EXAMPLE IV

The new tungsten disilicide polycide process that was described above with the help of FIG. 1 through 4 was used in this Example. The process flow of Example I was followed with the addition of the cleaning step described in Example II and the deletions of the thin silicon oxide oxidation (I) and the spacer densification process steps. No capping step was used.

The resulting polycide structure was bright and no peeling or noncrystalline surface layer were observed from our samples. The as-deposited tungsten disilicide layer was amorphous until the thin silicon oxide oxidation (II) thermal cycle caused the structure to become crystalline.

While the invention has been particularly shown and described with reference to the preferred embodiments, it will be understood by those skilled in the art that various changes in from and details may be made without departing from the spirit and scope of the invention. For example, while the detailed examples of the integrated circuits devices used N channel MOS FET, it is obvious that P channel, CMOS FET and BICMOS devices could be easily made.

What is claimed is:

1. The method for fabricating a lightly doped drain MOS FET integrated circuit device comprising:

forming a pattern of gate electrode structures upon a semiconductor substrate which structures each includes a gate oxide, a polysilicon layer and an amorphous refractory metal silicide;

forming a pattern of lightly doped regions in said substrate by ion implantation using said structures as the mask;

forming a dielectric spacer structure upon the sidewalls of each of said structures and over the adjacent portions of said substrate;

maintaining the said amorphous refractory metal silicide as amorphous up to this point in the process by maintaining the metal silicide at a temperature below about 450° C.;

forming a thin thermal silicon oxide over the exposed surfaces of said substrate, spacer and polycide layer and simultaneously transforming said refractory metal silicide from its amorphous form to its crystalline form;

forming a pattern of heavily doped regions in said substrate by ion implanation using the said structures with spacer structures as the mask to produce the lightly doped drain source/drain structures of an MOS FET device; and forming a passivation layer over the said structures and appropriate electrical connecting structures thereover to electrically connect the said gate electrode structures and source/drain elements to form said intergrated circuit device.

2. The method of claim 1 wherein the said refractory metal silicide is deposited in situ.

3. The method of claim 2 wherein the said refractory metal silicide is tungsten silicide.

4. The method of claim 1 wherein the thickness of the said refractory metal is between about 500 to 4000 Angstroms, the said polysilicon layer is heavily doped and the thickness of said polysilicon layer is between about 1000 to 4000 Angstroms.

5. The method of claim 1 wherein the said lightly doped regions are N-doped and said heavily doped regions are N+ doped to form N channel MOS FET integrated circuit.

6. The method of claim 1 wherein both P and N lightly doped drain MOS FET integrated circuit devices are formed on said substrate to provide CMOS FET circuit capability within said integrated circuit device.

7. The mehtod of claim 1 wherein the thickness of said thin silicon oxide is less than abbout 300 Angstroms, and the thermal oxidation that forms the layer is less than about 1000° C. for less than about 30 minutes.

8. The method of claim 3 wherein the thickness of said tungsten silicide layer is between about 500 to 4000 Angstroms and the thickness of the said polysilicon layer is between about 1000 to 4000 Angstroms.

9. The method of claim 1 wherein the said dielectric spacer structure is formed with a low temperature chemical vapor deposition method and an reactive ion anisotropic etching process to produce a silicon dioxide spacer.

10. The method of claim 1 wherein the structure in progress of being fabricated in not subjected to any thermal cycle prior to the said thin silicon oxide thermal oxidation and therefore the said amorphous refractory silicide remains amorphous until said thin silicon oxide thermal oxidation.

11. The method for fabricating a lightly doped drain MOS FET integrated circuit device comprising:
    forming a pattern of gate electrode structures upon a semiconductor substrate which structures each includes a gate oxide, a polysilicon layer and an amorphous refractory metal silicide;
    forming a pattern of lightly doped regions in said substrate by ion implantation using said structures as the mask;
    forming a dielectric spacer structure upon the sidewalls of each of said structures and over the adjacent portions of said substrate while maintaining said refractory metal silicide in its amorphous form;
    forming a thin thermal silicon oxide over the exposed surfaces of said substrate, spacer and polycide layer and simultaneously transforming said refractory metal silicide from its amorphous form to its crystalline form;
    forming a pattern of heavily doped regions in said substrate by ion implantation using the said structures with spacer structures as the mask to produce the lightly doped drain source/drain structures of an MOS FET device; and
    forming a passivation layer over the said structures and appropriate electrical connecting structures thereover to electrically connect the said gate electrode structures and source/drain elements to form said integrated circuit device;
wherein the structure in progress of being fabricated is not subjected to any thermal cycle above about 450° C. prior to the said thin silicon oxide thermal oxidation and therefore the said amorphous refractory metal silicide remains amorphous until said thin silicon oxide thermal oxidation.

12. The method of claim 11 wherein the said refractory metal silicide is tungsten disilicide having a thickness of between about 500 to 4000 Angstroms and where its chemical formula after said crystallization is $WSi_i$ where x is between about 2.2 to 2.8.

13. The method of claim 12 wherein the tungsten disilicide layer is maintained at a chemical formula of $WSi_x$ where x is between about 2.2 to 2.8 during its amorphous state from its deposition and prior to its crystallization.

14. The method of claim 11 wherein the said dielectric spacer structure is formed with a chemical vapor deposition method and an reactive ion anisotropic etching process to produce a silicon dioxide spacer.

15. The method for fabricating a double diffused drain MOS FET integrated circuit device comprising:
    forming a pattern of gate electrode structures upon a semiconductor substrate which structures each includes a gate oxide, a polsilicon layer and an amorphous refractory metal silicide;
    forming a dielectric spacer structure upon the sidewalls of each of said structures and over the adjacent portions of said substrate while maintaining said refractory metal silicide in its amorphous form;
    forming a thin thermal silicon oxide over the exposed surfaces of said substrate, spacer and polycide layer and simultaneously transforming said refractory metal silicide from its amorphous form to its crystalline form;
    forming a lightly doped region in the substrate by ion implantation;
    forming a pattern of heavily doped regions in said substrate by ion implantation in the same source/drain regions as said lightly doped region wherein the ions in the lightly doped regions will move to form the double diffused drain structure; and
    forming a passivation layer the said structures and appropriate electrical connecting structures thereover to electrically connect the said gate electrode structures and source/drain elements to form said integrated circuit device;
wherein the structure in progress of being fabricated is not subjected to any thermal cycle above about 450° C. prior to the said thin silicon oxide thermal oxidation and therefore the said amorphous refractory metal silicide remains amorphous until said thin silicon oxide thermal oxidation.

* * * * *